United States Patent
Park et al.

(10) Patent No.: US 6,404,363 B1
(45) Date of Patent: Jun. 11, 2002

(54) CIRCUIT FOR RECOVERING DIGITAL CLOCK SIGNAL AND METHOD THEREOF

(75) Inventors: Hyun-soo Park; Jae-seong Shim, both of Seoul; Yong-kwang Won, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/566,720

(22) Filed: May 9, 2000

(30) Foreign Application Priority Data

May 26, 1999 (KR) ............................................. 99-19020

(51) Int. Cl.[7] .............................................. H03M 1/00
(52) U.S. Cl. ....................................... 341/110; 341/118
(58) Field of Search ................................ 341/110, 118, 341/155; 369/59, 48

(56) References Cited

U.S. PATENT DOCUMENTS

| | | | | |
|---|---|---|---|---|
| 5,636,192 A | * | 6/1997 | Shimizume et al. | 369/48 |
| 5,841,323 A | * | 11/1998 | Fujimoto | 331/11 |
| 5,889,437 A | * | 3/1999 | Lee | 331/16 |
| 6,192,016 B1 | * | 2/2001 | Kim | 369/59 |

* cited by examiner

*Primary Examiner*—Peguy JeanPierre
(74) *Attorney, Agent, or Firm*—Staas & Halsey LLP

(57) ABSTRACT

A circuit for recovering a digital clock signal and a method therefor is disclosed. The digital clock recovery circuit includes an analog-to-digital (A/D) converter and asymmetry corrector for converting a received analog signal into digital data and providing corrected digital data corrected by a binarization level which traces the center value of the received signal, a frequency error detector for detecting a frequency error from the corrected digital data, a phase error detector for detecting a phase error from the corrected digital data, and a digital low pass filter (LPF) for providing the frequency error and the phase error as a control voltage. It is possible to trace the asymmetry of the received signal more sensitively than in the conventional technology by realizing an asymmetry corrector for correcting the asymmetry of the digital data which has undergone the analog-to-digital (A/D) conversion, the phase error detector, and the LPF by a digital circuit, thus generating a system clock signal and to improve the reliability of the system by stably generating the system clock signal.

26 Claims, 4 Drawing Sheets

CIRCUIT FOR RECOVERING DIGITAL CLOCK SIGNAL AND METHOD THEREOF

CROSS-REFERENCE TO RELATED APPLICATIONS

This application claims the benefit of Korean Application No. 99-19020, filed May 26, 1999, in the Korean Industrial Property Office, the disclosure of which is incorporated herein by reference.

BACKGROUND OF THE INVENTION

1. Field of the Invention

The present invention relates to the field of clock signal recovery, and more particularly, to a circuit for recovering a digital clock signal in a recording and/or reproducing apparatus of an optical disc and a method thereof.

2. Description of the Related Art

In the apparatus for recording data on and/or reproducing data from an optical disc such as a compact disc (CD) or a digital versatile disc (DVD), it is necessary to synchronize a reproduction signal with a system clock signal. A circuit which performs the synchronization process is a phase locked loop (PLL) circuit.

A PLL circuit locks a phase by generating a system clock signal through a voltage controlled oscillator (VCO). The VCO oscillates with a certain frequency with respect to a received signal, varying the frequency of the system clock signal, and locking the received signal to the varied system clock signal. In general, phase locking starts by determining whether the difference between the oscillation frequency of the VCO and the frequency of the received signal is within a predetermined range, and if not, performing frequency locking.

The conventional clock recovery circuit 90 used in an optical disc drives a PLL circuit shown in FIG. 1. The PLL circuit includes a binarization circuit 110, a frequency detector 120, a phase error detector 130, a low pass filter (LPF) 140, and a VCO 150. The analog signal read from an optical disc 100 is received by a binarization circuit 110, which compares the received signal with a binarization level, and provides a binarized signal. The binarization circuit 110 can be, for example, a comparator.

When the frequency difference received by the frequency error detector 120 is within a first predetermined range, the frequency error detector 120 receives the binarized signal and detects the difference between the frequency of the binarized signal and the frequency of the system clock signal generated by the VCO 150. The frequency error detector 120 provides the difference to the LPF 140. The LPF 140 provides a control voltage corresponding to the frequency difference to the VCO 150.

When the frequency difference is within a second predetermined range, the frequency error detector 120 does not operate. Instead, the phase error detector 130 detects the phase difference between the binarized signal and the system clock signal, and the detected phase difference is provided to the LPF 140. The LPF 140 provides the control voltage corresponding to both the frequency difference and the phase difference to the VCO 150.

The VCO 150 generates a system clock signal synchronized with the received signal according to the control voltage signal provided by the LPF 140. While not shown in FIG. 1, the VCO 150 provides the system clock signal as a driving clock signal to the frequency error detector 120 and the phase error detector 130.

Using a conventional PLL circuit, the binarization circuit 110 and the LPF 140 are both analog circuits. Since they are analog, the performance of the PLL circuit deteriorates due to noise passing through the LPF 140. In addition, it is difficult to correct the binarization level corresponding to the received signal using the binarization circuit 110. Also, using a conventional analog filter, it is difficult to properly adjust the LPF 140 to account for a multiple-speed mode. Basically, in order to correctly utilize the binarized signal, the LPF 140 must include a circuit which traces the center value of the received analog signal. Since the LPF 140 is analog, it is not possible to freely change the frequency band to account for this center value, and noise is mixed in the signal no matter how fine the filter is.

One solution has been having the binarization circuit 110 that incorporates a partial response maximum likelihood (PRML) method. Such a binarization circuit 110 has a structure that outputs a binary signal that is adjusted to the statistical characteristic of the received signal using sampled data. This sampled data is obtained by converting the analog signal into a digital signal, correcting the center value of the analog signal using the sampling value obtained by the analog-to-digital (A/D) conversion, and synchronizing the sampled data with a system clock signal using the center value of the received analog signal. However, these functions are difficult to realize using an analog structure.

In addition, when an analog LPF 140 is used to provide both the frequency error and the phase error as the control voltage of the VCO 150, it is not possible to freely change the frequency band, which mixes the noise in the signal. Therefore, an analog LPF is difficult to apply to newer optical disc products which have a high multiple speed mode.

SUMMARY OF THE INVENTION

Accordingly, it is an object of the present invention to provide a digital clock recovery circuit having a digital binarization circuit and low pass filter (LPF).

It is another object of the present invention to provide a method of correcting asymmetry of an analog signal read from an optical disc, binarizing the corrected analog signal, digital signal processing the corrected binarized signal, and recovering a system clock signal.

Additional objects and advantages of the invention will be set forth in part in the description which follows and, in part, will be obvious from the description, or may be learned by practice of the invention.

To achieve the first and other objects of the present invention, there is provided a digital clock recovery circuit for recovering a system clock signal locked to a received analog signal, comprising an analog-to-digital (A/D) converter and asymmetry corrector which corrects a received signal into digital data and provides corrected digital data that is corrected by a binarization level which traces the center value of the received analog signal, a frequency error detector which detects a frequency error from the corrected digital data, a phase error detector which detects a phase error from the corrected digital data, a digital low pass filter (LPF) which provides the frequency error and the phase error as a control voltage, and a clock generator which generates a system clock signal whose frequency and phase are varied according to the control voltage and provides the system clock signal as driving clock signals of the respective elements.

To achieve the second and other objects of the present invention, there is provided a method of recovering a system clock signal locked to a received signal by a phase locked loop (PLL), comprising converting a received analog signal into digital data and providing digital data corrected by a binarization level which traces the center value of the received analog signal, detecting a frequency error from the corrected digital data, detecting a phase error from the corrected digital data, and low pass filtering the phase error and providing the low pass filtered phase error to a control voltage of the PLL together with the frequency error.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
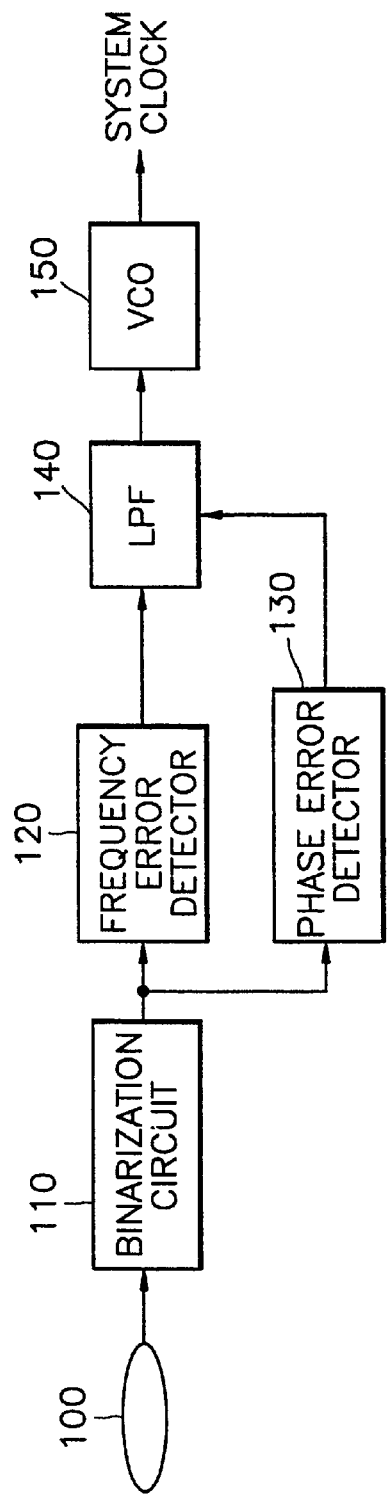
FIG. 1 is a block diagram of a conventional clock recovery circuit.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
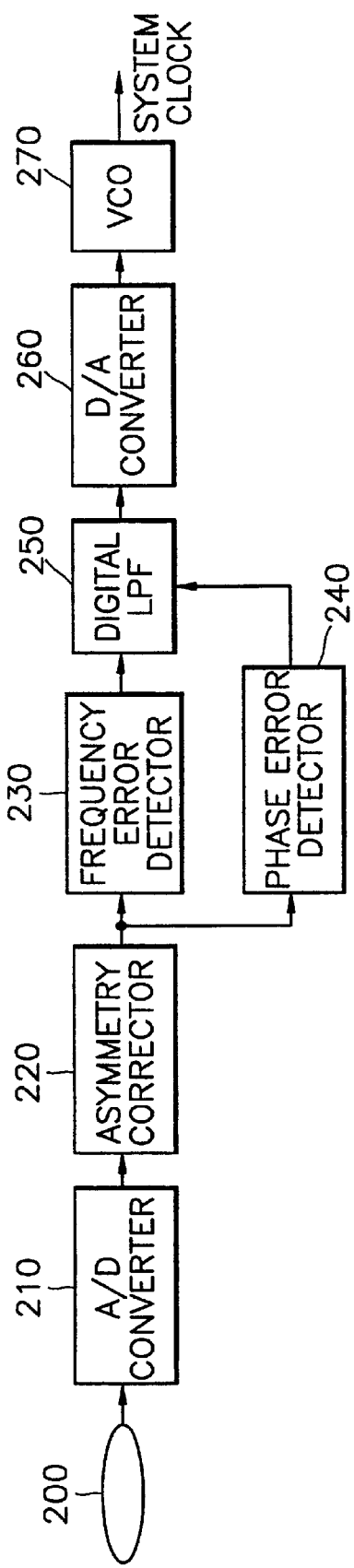
FIG. 2 is a block diagram according to an embodiment of a digital clock recovery circuit according to the present invention.

FIG. 2 shows a block diagram of a digital clock recovery circuit 190 according to an embodiment of the present invention. The digital clock recovery circuit 190 has an analog-to-digital (A/D) converter 210 that converts an analog signal read from an optical disc 200 into digital data. The A/D converter 210 provides the digital data to an asymmetry corrector 220 that generates a corrected binarization level according to the statistical characteristic of the received analog signal so as to binarize the received analog signal in an optimal state, corrects the binarization level of the digital data according to the corrected binarization level, and provides the resulting corrected digital data to a frequency error detector 230, and a phase error detector 240.

When the frequency difference is within a first predetermined range, the frequency error detector 230 obtains the frequency difference between the received corrected digital data provided by the asymmetry corrector 220 and the system clock signal generated by the VCO 270 and provides a frequency error signal. However, when the frequency difference is in a narrower second predetermined range, the frequency error detector does not operate and, instead, the phase error detector 240 provides a phase error signal. The phase error detector 240 obtains the phase difference between the system clock signal and the received analog signal, which for frequency errors within the second predetermined range is already roughly locked to the system clock, and then correctly locks the system clock signal to the received analog signal. Basically, the frequency error signal is provided by the frequency error detector 230 to a digital low pass filter (LPF) 250 when the frequency error is in the first predetermined range, and the phase error detector 240 provides the phase error signal to the digital LPF 250 in order to lock the received analog signal to the system clock signal for those frequency errors that are within the second predetermined range.

The digital LPF 250 converts the frequency and phase error signals into digital voltage data. The digital-to-analog (D/A) converter 260 converts the digital voltage data into an analog voltage signal and provides the analog voltage signal as a control voltage signal to the VCO 270. The VCO 270 generates a system clock signal of a reference frequency locked to the received control voltage signal. While not shown in FIGS. 2, 3, 5, and 6, the VCO 270 provides the system clock signal to the A/D converter 210, the asymmetry corrector 220, the frequency error detector 230, the phase error detector 240, and the digital LPF 250 as a driving clock signal.

Figure 3:
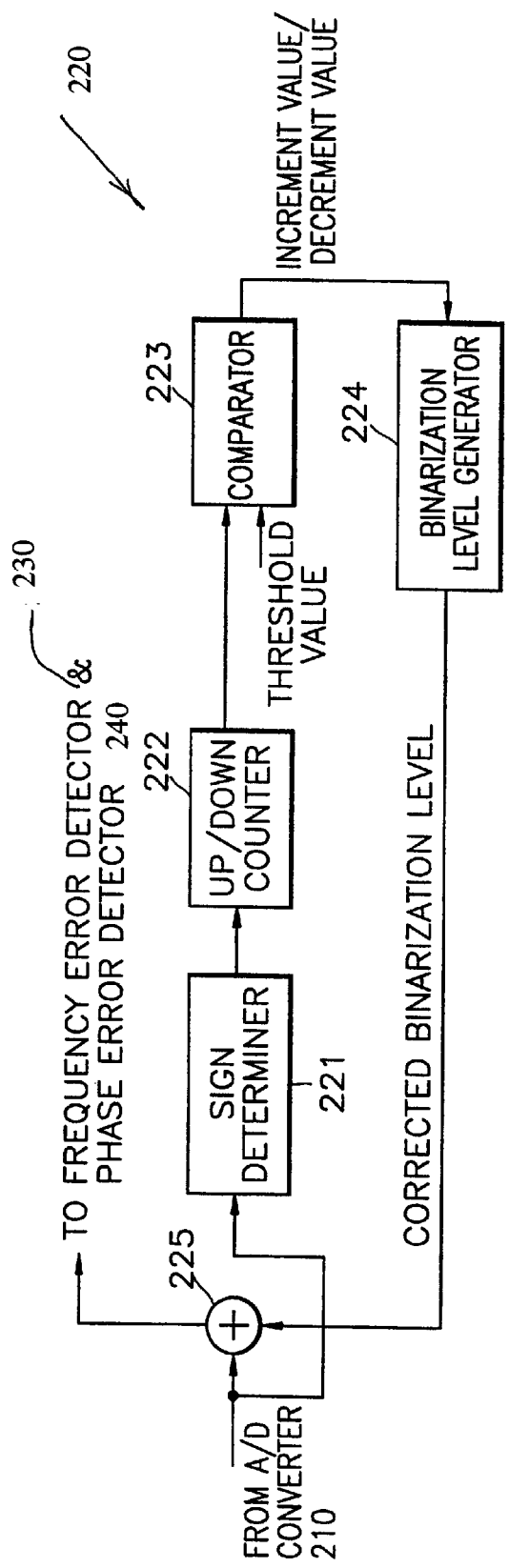
FIG. 3 is a detailed block diagram of an asymmetry corrector shown in FIG. 2.

FIG. 3 shows a detailed circuit diagram of the asymmetry corrector 220. The asymmetry corrector 220 includes a sign determiner 221, an up/down counter 222, a comparator 223, a binarization level generator 224, and an adder 225. The sign determiner 221 determines whether the sign of the digital data provided by the A/D converter 210 shown in FIG. 2 is positive or negative, and provides the sign determination result to the up/down counter 222. The up/down counter 222 increases the count value when the sign determination result of the sign determiner 221 is positive, and decreases the count value when the sign determination result is negative. The count value of the up/down counter 222 increases or decreases according to the asymmetry of the received signal, which provides an indication of the statistical characteristics of the received analog signal. Basically, the more positive or negative signs detected by the up/down counter 222, the more that the binarization level will have to be adjusted positively or negatively to re-zero the digital data.

To make this adjustment, the comparator 223 compares the count value with a threshold value, determines whether the count value of the up/down counter 222 increases more than or decreases less than the threshold value, and provides an increment value or a decrement value to the binarization level generator 224. The binarization level generator 224 then corrects the binarization level for a sign determination level according to the increment value or the decrement value provided by the comparator 223, and generates a corrected binarization level. The corrected binarization level adjusts the sign determination level positively or negatively so as to trace the center of the received analog signal.

Finally, the adder 225 adds the corrected binarization level to the digital data provided by the A/D converter 210, and provides the corrected digital data to the frequency detector 230 and the phase error detector 240. Thus, using the asymmetry corrector 220, the asymmetry of the received digital data signal is corrected. While not shown, it is understood that adder 225 can also be a corrector. In addition, it is understood that the comparator 223 can be located inside the binarization level generator 224.

Figure 4:
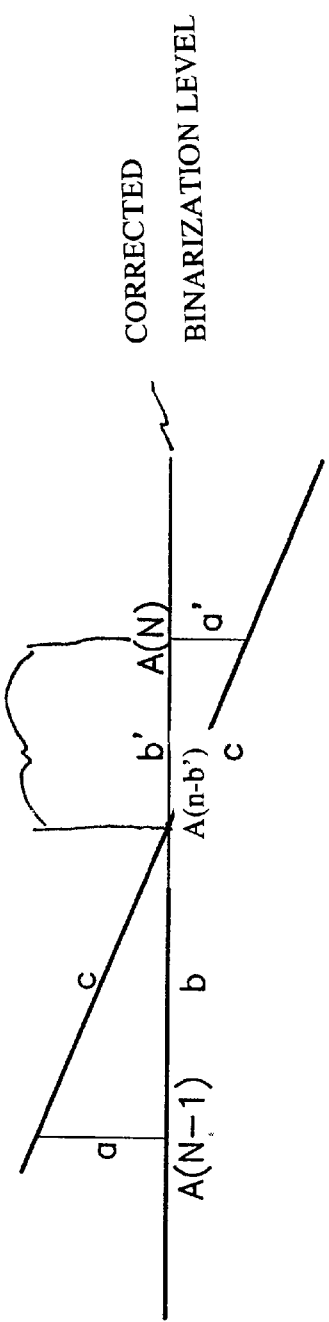
FIG. 4 explains the phase error detection principle according to the present invention.
Figure 5:
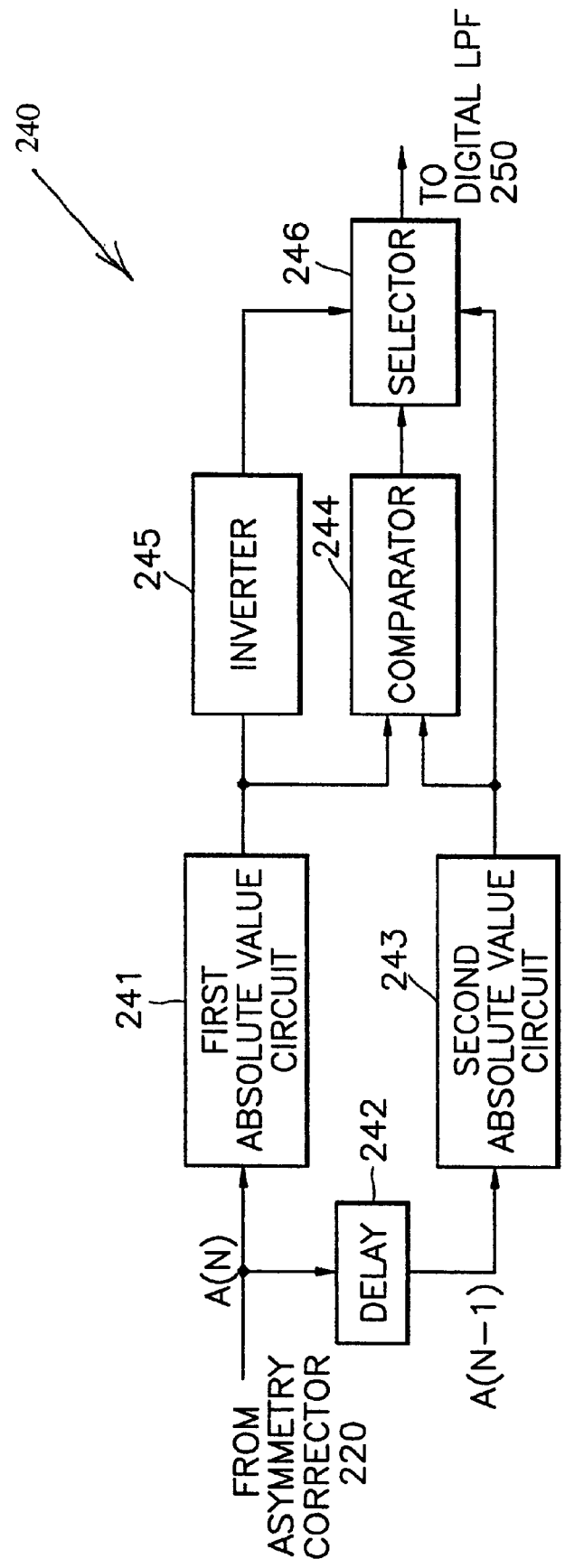
FIG. 5 is a detailed block diagram of the phase error detector shown in FIG. 2.

In order to detect the phase error, the digital clock recovery circuit 190 uses the phase error detector 240 in FIG. 5. In general, the phase error indicates the difference between the phase of the system clock signal, and the phase of the received analog signal. For the phase error detection principle employed by this embodiment, if the received analog signal is correctly locked to the system clock signal, the received corrected digital data is sampled at the point in time when the received corrected digital data is transitioning between signs, which results in the corrected digital data being precisely 0 at this point. However, as shown in FIG. 4, when there is a phase error, the corrected digital data is not sampled at the point in time when the sign of the corrected digital data is changed, which means that the corrected digital data is not 0. Therefore, when there is a phase error, corrected digital data points before and after the point in time when the sign changed are received, the absolute values of these corrected digital data points are obtained, and the corrected digital data point having the smaller absolute value is considered the phase error. Thus, the corrected digital data value having the smaller absolute value at the two points in time when the sign changed becomes the phase error.

A graphical representation of the phase error principle is shown in FIG. 4. In FIG. 4, the phase error value is actually the value corresponding to b'. It is not possible to directly determine the value of b'. However, the values of a, and a' are the known values of corrected digital data for different times before and after the sign change, and the total of b+b' is known to be one clock cycle. As such, by assuming that the corrected digital data is linear at the point in time when the sign is changed, the shape of the triangle a-b-c is similar to that of the triangle a'-b'-c'. As a result, b' can be expressed as a function of known values a, a', and b+b'. As a further simplification, however, in the present embodiment, since a' is smaller than a, the value of a' can be used to approximate the value of the phase error b' with acceptable error.

Based on this assumption, the phase error detector 240 is constructed as shown in FIG. 5. The phase error detector 240 includes first and second absolute value circuits 241 and 243, a delay 242, a comparator 244, an inverter 245, and a selector 246. The first absolute value circuit 241 receives corrected digital data, A(N), at the point in time when a sign change is detected, and provides the absolute value of A(N) as first sampling data. The second absolute value circuit 243 receives the previous corrected digital data, A(N−1), at the point in time just prior to when the sign is changed. The previous corrected digital data is provided from the delay 242 such that it is one clock cycle behind A(N). The delay 242 provides the absolute value of the previous corrected digital data A(N−1) as second sampling data. The delay 242 can be any delay mechanism, but in this embodiment, the delay 242 is a D flip-flop.

The comparator 244 compares the first sampling data provided by the first absolute value circuit 241 with the second sampling data provided by the second absolute value circuit 243, and provides a selection control signal to the selector 246 so that a signal having the smaller absolute value is selected. In this embodiment, when the first sampling data is smaller, the comparator 244 generates a logic "low" selection control signal. Conversely, when the second sampling data is smaller, the comparator 244 generates a logic "high" selection control signal.

The inverter 245 receives the first sampling data from the first absolute value circuit 241, and changes the sign to negative. The inverter 245 is used to ensure that the first sampling data is always negative when received by the selector 246. The inverter 245 can be any mechanism that provides a negative sign to a signal, which in this embodiment is a multiplier for multiplying the first sampling data by "−1".

When the comparator 244 provides a logic "low" selection control signal to the selector 246, the selector 246 outputs the negative of the first sampling data provided by the inverter 245 as the phase error. When the comparator provides a logic "high" selection control signal to the selector 246, the selector 246 outputs the second sampling data as the phase error.

The sign of the phase error signal is included in order to indicate whether the phase of corrected digital data leads the system clock signal, or lags the system clock signal. If the phase error value is detected from the sampling data A(N), the negative sign indicates that the phase of the received analog signal leads the phase of the system clock signal. As such, the VCO 270 lengthens the period of system signal clock to account for the phase error having a magnitude of A(N). Conversely, if the phase error value is detected from the sampling data A(N−1), the positive sign indicates that the phase of the received analog signal lags the phase of the system clock signal. As such, the VCO 270 shortens the period of the system clock signal to account for the phase error having a magnitude of A(N−1). In this way, both the magnitude of the phase error is passed to the VCO 270, as well as the lead/lag relationship of this value to the system clock signal.

Figure 6:
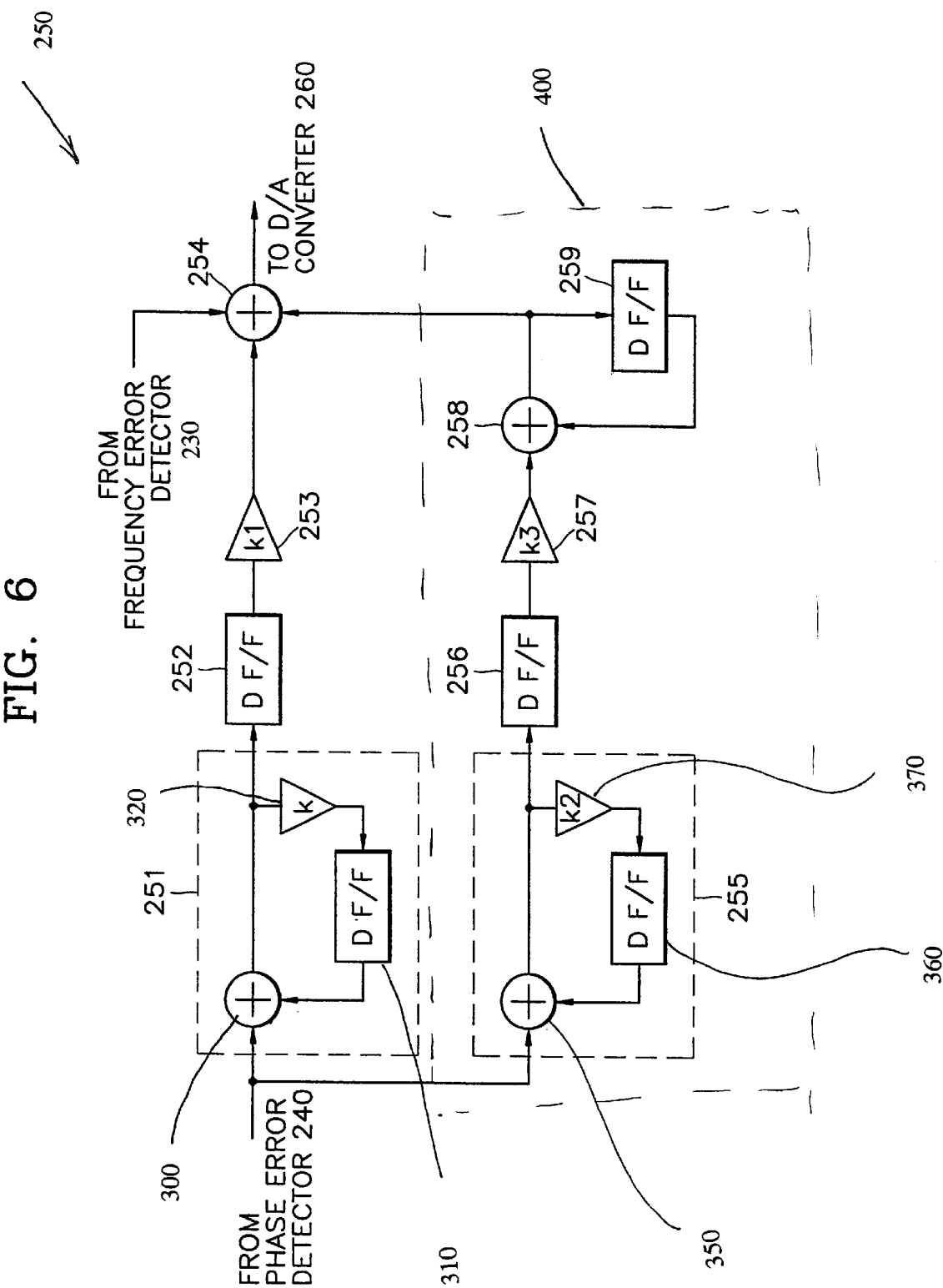
FIG. 6 is a detailed circuit diagram of the digital low pass filter (LPF) shown in FIG. 2.

FIG. 6 shows the digital LPF 250. The digital LPF 250 includes first and second digital filters 251 and 255, first, second, and third D flip-flops (D F/Fs) 252, 256, and 259, first and second multipliers 253 and 257, and first and second adders 254 and 258. The phase error signal provided by the phase error detector 240 is provided to the first and second digital filters 251 and 255. The frequency error signal provided by the frequency error detector 230 is provided to the first input port of the first adder 254.

The phase error signal passes through the first and second digital filters 251 and 255. The first digital filter 251 has a first digital filter adder 300 that receives the phase error at one input port, a first digital filter multiplier 320 that multiplies the output of the first digital filter adder 300 by a predetermined time constant, k, and a first digital filter D F/F 310 that delays the output of the first digital filter multiplier 320 by one clock cycle, and then provides this delayed output to the other input port of the first digital filter adder 300. In addition, the second digital filter 255 has a second digital filter adder 350 that receives the phase error at one input port, a second digital filter multiplier 370 that multiplies the output of the second digital filter adder 350 by a predetermined time constant, k2, and a second digital filter D F/F 360 that delays the output of the second digital filter multiplier 370 by one clock cycle, and provides this delayed output to the other input port of the second digital filter adder 350. The digital filters 251 and 255, which are LPFs, filter the phase error signal and smooth the waveform of the phase error signal. In general, the first and second digital filters 251 and 255 each have the form of a first order infinite impulse response (IIR) filter.

The first digital filter 251 affects the stability of the digital clock recovery circuit 190. This is apparent since, if the phase error signal is provided to the VCO 270 through the D/A converter 260 without being subjected to the low pass filtering by the first digital filter 251, the VCO 270 reacts so sensitively to its inputted signals, that the entire digital clock recovery circuit 190 destabilizes. Therefore, it is possible to control the stability and minimize the phase error of the system by adjusting the time constant value of k of the first digital filter multiplier 320. In general, the value of the time constant k used for the first digital filter 251 is determined using $k=1\frac{1}{2}^M$, where M is a positive integer.

According to the present embodiment, the entire gain of the combined first digital filter 251, the first D F/F 252, and the first multiplier 253 is 1. The output signal of the first digital filter 251 is provided to the first D F/F 252, which delays the output delaying one clock cycle. The delayed output is then multiplied in the first multiplier 253 by the time constant k1. In order to meet the above gain restriction for the present embodiment, the time constant k1 is determined by k1=½$^M$ (where M is the same positive integer used to calculate k). The output of the first multiplier 253 is provided to the second input port of the first adder 254.

The second digital filter 255 operates as the LPF like the first digital filter 251. However, since the second digital filter 255 outputs to a structure that adds the output of the second digital filter 255 thereof to a previous output, the phase error signal accumulates with the passing of time. The output of the second digital filter 255 is provided to the second D F/F 256, which delays the output for one clock cycle. Then, the delayed output is provided to the second multiplier 257, which multiples the delayed output by the time constant k3 and the multiplication result is received by one input port of the second adder 258.

The second adder 258 adds the output of the second multiplier 257 to the output of the third D F/F 259, to perform an accumulative operation. The second adder 258 provides this accumulative result to the to a third input port of the first adder 254 and the third D F/F 259. The third D F/F 259 delays the accumulative result for one clock cycle, and then provides this result to the second adder 258. Using this structure, the phase error is accumulated over time.

In the present embodiment, the time constant K2 of the second digital filter 255 has the form of 1½$^M$ like the time constant k of the first digital filter 251. The time constant k3 used by the second multiplier 257 has the form of ½$^M$ like the time constant k1 used by the first multiplier 253. However, since the time constant k3 must be used for correcting offset, the time constant k3 is set to be much smaller than k1.

The offset controller 400 includes the second digital filter 255, the second D F/F 256, the second multiplier 257, the second adder 258, and the third D F/F 259. The offset controller 400 finely traces a direct current (DC) offset voltage change using the received phase error signal, and adjusts the DC offset voltage of the entire digital clock recovery circuit 190.

While not shown, instead of the circuit shown in FIG. 6, the digital LPF 250 can be realized by any filter which has the filter characteristic of Equation (1). Basically, the digital LPF 250 can be created using a digital filter which has the form of a general infinite impulse response (IIR).

$$H(z) = \frac{Y(z)}{X(z)} = \frac{\sum_{i=0}^{r} L_i z^{-i}}{1 + \sum_{j=1}^{m} K_j z^{-j}} \quad (1)$$

wherein, X(z) represents a z transform of a received signal, which in the present invention is the frequency error signal and the phase error signal, Y(z) represents a z transform of an output signal, which in the present invention is the output the first multiplier 253 and the second adder 258, and H(z) represents a transfer function by z transform. K and L are time constants, and r and m are positive integers.

The present invention can be widely applied to the clock recovery circuits of digital devices which use the PLL as well as the clock recovery circuit of the optical disc system.

According to the present invention, it is possible to trace the asymmetry of the received analog signal more sensitively than in the conventional technology, while correcting the asymmetry of the digital data which has undergone the analog-to-digital (A/D) conversion and generating the system clock signal, thereby improving the reliability of the system by stably generating the system clock signal corresponding to various discs.

The digital clock recovery circuit 190 according to the present invention greatly reduces noise and prevents miscalculations by digitizing the binarization level of the received signal and the phase error detection. Also, in the digital clock recovery circuit 190 according to the present invention, the structure of the filter does not need to be changed due to a change of a multiple-speed mode of the optical disc since a self corrected digital LPF is used.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital clock recovery circuit for recovering a system clock signal locked to a received analog signal, comprising:
   an analog-to-digital (A/D) converter and asymmetry corrector which converts the received analog signal into digital data, and provides corrected digital data that is corrected by a binarization level wherein the binarization level traces a center value of the received analog signal;
   a frequency error detector which detects a frequency error from the corrected digital data;
   a phase error detector which detects a phase error from the corrected digital data;
   a digital low pass filter (LPF) which provides a control voltage using the frequency error and the phase error; and
   a clock generator which generates the system clock signal whose frequency and phase are varied according to the control voltage, and provides the system clock signal as driving clock signals for the asymmetry corrector, the frequency error detector, the phase error detector, and the digital LPF.

2. The digital clock recovery circuit of claim 1, wherein the A/D converter and asymmetry corrector comprises:
   an A/D converter which converts the received analog signal into the digital data;
   a sign determiner which determines whether a sign of the digital data provided by the A/D converter is positive or negative, and provides a sign determination result;
   an up/down counter which continuously increases a count value when the sign determination result of the sign determiner is positive, and continuously decreases the count value when the sign determination result of the sign determiner is negative, wherein the count value is increased or decreased according to the asymmetry of the received analog signal;
   a binarization level generator which compares the count value of the up/down counter with a threshold value, determines whether the count value of the up/down counter increases more than or decreases less than the threshold value, corrects the binarization level for a sign determination level according to an increment value or a decrement value, and generates the corrected binarization level; and
   a corrector which adds the corrected binarization level to the digital data provided by the A/D converter, and provides the corrected digital data wherein the asymmetry of the digital data received signal is corrected.

3. The digital clock recovery circuit of claim 1, wherein the phase error detector comprises:

a first absolute value circuit which receives the corrected digital data when the sign is changed, and takes the absolute value of the corrected digital data when the sign is changed to provide first sampling data;

a second absolute value circuit which receives previous corrected digital data prior to when the sign is changed, and takes the absolute value of the previous corrected digital data to provide second sampling data; and a detector which provides the first sampling data as the phase error whose sign is always negative when the first sampling data is smaller than the second sampling data, and provides the second sampling data as the phase error when the second sampling data is smaller than the first sampling data.

4. The digital clock recovery circuit of claim 3, wherein the detector comprises:

a comparator which compares the first sampling data with the second sampling data and generates a selection control signal so that the smaller of the first and second sampling data is selected;

an inverter which changes the sign of the first sampling data to be negative; and a selector which provides either the first sampling data whose sign is negative from the inverter as the phase error or providing the second sampling data from the second absolute circuit as the phase error according to the selection control signal.

5. The digital clock recovery circuit of claim 1, wherein the digital LPF comprises:

a first digital filter having a first time constant, wherein the first digital filter low pass filters the phase error; and a first multiplier which multiplies the low pass filtered phase error of the first digital filter by a second time constant wherein an entire gain of the first digital filter and the first multiplier is 1.

6. The digital clock recovery circuit of claim 5, wherein the digital LPF further comprises:

an offset controller which finely traces a direct current (DC) offset voltage change using the phase error, and provides an offset value which controls the DC offset voltage of the digital clock recovery circuit; and an adder which adds the frequency error, the output of the first multiplier, and the offset value to provide an addition result, and provides the addition result to the clock generator as a control voltage.

7. The digital clock recovery circuit of claim 6, wherein the offset controller comprises:

a second digital filter having a third time constant, wherein the second digital filter low pass filters the phase error;

a second multiplier which multiplies the low pass filtered phase error of the second digital filter by a fourth time constant wherein an entire gain of the second digital filter and the second multiplier is 1; and an accumulator which adds output of the second multiplier to a previous output of the second multiplier and accumulates the low pass filtered phase error with the passing of time.

8. The digital clock recovery circuit of claim 7, wherein each of the first and second digital filters has the form of a first order infinite impulse response (IIR) filter, comprising:

a digital filter adder having input ports wherein the digital filter receives the phase error at one of the input ports;

a digital filter multiplier which multiplies the output from the digital filter adder by a predetermined time constant; and a digital filter delay which delays the output of the digital filter multiplier by one clock cycle, and feeds the delayed output to another of the input ports of the digital filter adder.

9. The digital clock recovery circuit of claim 7, wherein the first and the third time constants are determined by $1\frac{1}{2}^M$, and the second and fourth time constants are determined by $\frac{1}{2}^M$, wherein M is a positive integer.

10. The digital clock recovery circuit of claim 1, wherein the digital LPF has the following filter characteristic:

$$H(z) = \frac{Y(z)}{X(z)} = \frac{\sum_{i=0}^{r} L_i z^{-i}}{1 + \sum_{j=1}^{m} K_j z^{-j}}$$

wherein, X(z) represents a z-transform of the frequency error or phase error received by the digital LPF, Y(z) represents a z-transform of the control voltage, H(z) represents a transfer function by z-transform, L and K are time constants, and r and m are positive integers.

11. A digital clock recovery circuit for recovering a system clock signal locked to a received digital signal using a phase locked loop (PLL) including a frequency error detector to detect a frequency error of the received digital signal, a phase error detector to detect a phase error of the received digital signal, a digital low pass filter (LPF) to provide a control voltage corresponding to the frequency error and the phase error, and a voltage controlled oscillator (VCO) to generate the system clock signal locked to the received digital signal according to the control voltage, wherein the digital LPF comprises:

a first digital filter having a first time constant, wherein the first digital filter low pass filters the phase error;

a first multiplier which multiplies the low pass filtered phase error of the first digital filter by a second time constant wherein an entire gain of the first digital filter and the first multiplier is 1;

an offset controller which finely traces a direct current (DC) offset voltage change using the phase error and provides an offset value for controlling the DC offset voltage of the digital clock recovery circuit; and an adder which adds the frequency error, the output of the first multiplier, and the offset value to provide an additive result, and provides the additive result to the VCO as a control voltage.

12. The digital clock recovery circuit of claim 11, wherein the offset controller comprises:

a second digital filter having a third time constant, wherein the second digital filter low pass filters the phase error;

a second multiplier which multiplies the low pass filtered phase error of the second digital filter by a fourth time constant wherein an entire gain of the second digital filter and the second multiplier is 1; and an accumulator which adds output of the second multiplier to a previous output of the second multiplier and wherein the low pass filtered phase error accumulates with the passing of time.

13. The digital clock recovery circuit of claim 12, wherein each of the first and second digital filters has the form of a first order infinite impulse response (IIR) filter, comprising:

a digital filter adder having input ports where one input port receives the phase error;

a digital filter multiplier which multiplies output of the digital filter adder by a predetermined time constant; and a digital filter delay which delays output of the digital filter multiplier by one clock cycle, and feeds delayed output to another input port of the digital filter adder.

14. The digital clock recovery circuit of claim 12, wherein the first and third time constants are determined by $1\frac{1}{2}^M$ and the second and fourth time constants are determined by $\frac{1}{2}^M$, wherein M is a positive integer.

15. The digital clock recovery circuit of claim 11, wherein the digital LPF comprises a digital circuit which has the following filter characteristic:

$$H(z) = \frac{Y(z)}{X(z)} = \frac{\sum_{i=0}^{r} L_i z^{-i}}{1 + \sum_{j=1}^{m} K_j z^{-j}}$$

wherein, X(z) represents a z-transform of the phase error and the frequency error, Y(z) represents a z-transform of the control voltage, H(z) represents a transfer function by z-transform, L and K are time constants, and r and m are positive integers.

16. A method of recovering a system clock signal locked to a received analog signal by a phase locked loop (PLL), comprising:

converting the received analog signal into digital data;

correcting the digital data by a binarization level which traces a center value of the received analog signal to provide corrected digital data;

detecting a frequency error from the corrected digital data;

detecting a phase error from the corrected digital data;

low pass filtering the phase error to provide a low pass filtered phase error; and using the low pass filtered phase error and the frequency error to generate a control voltage of the PLL.

17. The method of claim 16, wherein the step of correcting comprises:

determining whether a sign of the digital data is positive or negative and providing a sign determination result;

increasing or decreasing a count value according to a asymmetry of the digital data by increasing the count value when the sign determination result is positive and decreasing the count value when the sign determination result is negative;

comparing whether the count value increases more than or decreases less than a threshold value, correcting the binarization level for a sign determination level according to an increment value or a decrement value, and generating a corrected binarization level; and adding the corrected binarization level to the digital data and providing corrected digital data where the asymmetry of the digital data is corrected.

18. The method of claim 16, wherein the step of detecting comprises:

receiving corrected digital data when the sign is changed and providing an absolute value of the corrected digital data to provide first sampling data;

receiving previous corrected digital data prior to when the sign is changed and providing an absolute value of the previous corrected digital data to provide second sampling data; and changing the sign of the first sampling data to provide first sampling data whose sign is always negative; and outputting the first sampling data whose sign is always negative as a phase error when the first sampling data is smaller than the second sampling data, and outputting the second sampling data as the phase error when the second sampling data is smaller than the first sampling data.

19. The method of claim 16, wherein the low pass filtering step comprises:

low pass filtering the phase error using a first predetermined time constant and providing a first filtered signal;

multiplying the first filtered signal by a second time constant and providing a first multiplication result wherein an entire gain of the first low pass filtering step and the first multiplying step is 1;

finely tracing a direct current (DC) offset voltage change using the phase error and providing an offset value for controlling the DC offset voltage of the PLL; and adding the frequency error, the first multiplication result, and the offset value to provide an addition result and providing the addition result as a control voltage.

20. The method of claim 19, wherein the finely tracing step comprises:

low pass filtering the phase error using a third time constant and providing a second filtered signal;

multiplying a fourth time constant by the second filtered signal and providing a second multiplication result wherein an entire gain of the second low pass filtering step and the second multiplying step is 1; and adding the second multiplication result to a previous second multiplication result and accumulating the low pass filtered phase error with the passing of time.

21. The method of claim 19, wherein the first and third time constants are determined by $1\frac{1}{2}^M$, and the second and fourth time constants are determined by $\frac{1}{2}^M$, wherein M is a positive integer.

22. A digital clock recovery circuit for recovering a system clock signal locked to a received analog signal, wherein the digital clock recovery circuit includes an analog-to-digital converter to convert the received analog signal into digital data, frequency error detector which generates a frequency error signal based on received corrected digital data, a phase error detector which generates a phase error signal based on received corrected digital data, comprising:

a binarization corrector that corrects a binarization level of the digital data to trace a center of the received analog signal to provide the corrected digital data;

a digital low pass filter (LPF) that provides a control voltage using the frequency error signal and the phase error signal; and a clock generator which generates the system clock signal according to the control voltage wherein the system clock signal is locked to the received analog signal, and wherein the system clock signal is the driving clock signal for the respective elements.

23. The digital clock recovery circuit of claim 22, wherein the binarization corrector comprises an asymmetry corrector which detects the number of positive and negative signs detected in the digital data, and adjusts the binarization level based upon the number of positive and negative signs detected in the digital data in order to trace the center of the received analog data.

24. The digital clock recovery circuit of claim 22, wherein the phase error detector detects a change in sign of the corrected digital data, compares a magnitude of the corrected digital data before and after the change in sign, approximates a magnitude of the phase error using the smaller of the corrected digital data before and after the change in sign, and provides lead/lag information in addition to the magnitude of the phase error.

25. The digital clock recovery circuit of claim 22, wherein the digital LPF has the following filter characteristic:

$$H(z) = \frac{Y(z)}{X(z)} = \frac{\sum_{i=0}^{r} L_i z^{-i}}{1 + \sum_{j=1}^{m} K_j z^{-j}}$$

wherein, X(z) represents a z-transform of the phase error and the frequency error, Y(z) represents a z-transform of the control voltage, H(z) represents a transfer function by z-transform, L and K are time constants, and r and m are positive integers.

26. The digital clock recovery circuit of claim 25, wherein the digital LPF comprises a digital filter and a multiplier to stabilize the digital clock recovery circuit using the phase error signal; and an offset controller to finely trace a direct current voltage using the phase error signal.

* * * * *

UNITED STATES PATENT AND TRADEMARK OFFICE
CERTIFICATE OF CORRECTION

PATENT NO. : 6,404,363 B1
DATED : June 11, 2002
INVENTOR(S) : Hyun-Soo Park et al.

It is certified that error appears in the above-identified patent and that said Letters Patent is hereby corrected as shown below:

<u>Title page,</u>
Item [56], References Cited, please add:

-- FOREIGN REFERENCES
JP 11-328854   11/1999 Japan --.

Signed and Sealed this

Twenty-sixth Day of November, 2002

*Attest:*

*Attesting Officer*

JAMES E. ROGAN
*Director of the United States Patent and Trademark Office*